(12) United States Patent
Takikawa

(10) Patent No.: US 11,114,278 B2
(45) Date of Patent: Sep. 7, 2021

(54) POWER SUPPLY DEVICE FOR PLASMA, PLASMA DEVICE, AND METHOD FOR CONTROLLING POWER SUPPLY DEVICE FOR PLASMA

(71) Applicant: FUJI CORPORATION, Chiryu (JP)

(72) Inventor: Shinji Takikawa, Anjo (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/759,549

(22) PCT Filed: Nov. 22, 2017

(86) PCT No.: PCT/JP2017/041939
§ 371 (c)(1),
(2) Date: Apr. 27, 2020

(87) PCT Pub. No.: WO2019/102536
PCT Pub. Date: May 31, 2019

(65) Prior Publication Data
US 2020/0273669 A1 Aug. 27, 2020

(51) Int. Cl.
*H01J 37/32* (2006.01)
*H02M 7/5387* (2007.01)

(52) U.S. Cl.
CPC ... *H01J 37/32009* (2013.01); *H02M 7/53871* (2013.01)

(58) Field of Classification Search
CPC . H01J 37/32009; H01J 37/32; H02M 7/53871
See application file for complete search history.

(56) References Cited

U.S. PATENT DOCUMENTS

| 5,556,549 A * | 9/1996 | Patrick | H01J 37/32082 118/712 |
| 10,396,720 B2 * | 8/2019 | Grede | H01F 27/2804 |
| 2005/0134186 A1 * | 6/2005 | Brouk | H01J 37/32183 315/111.21 |
| 2010/0270141 A1 * | 10/2010 | Carter | H01J 37/3299 204/164 |
| 2014/0256066 A1 * | 9/2014 | Sato | H01L 22/20 438/14 |

(Continued)

FOREIGN PATENT DOCUMENTS

| JP | 2008-293925 A | 12/2008 |
| JP | 2012-174736 A | 9/2012 |
| JP | 2015-136196 A | 7/2015 |

OTHER PUBLICATIONS

International Search Report dated Feb. 27, 2018 in PCT/JP2017/041939 filed Nov. 22, 2017.

*Primary Examiner* — Alexander H Taningco
*Assistant Examiner* — Pedro C Fernandez
(74) *Attorney, Agent, or Firm* — Oblon, McClelland, Maier & Neustadt, L.L.P.

(57) ABSTRACT

A plasma power supply device includes an AC power supply configured to generate an AC voltage of a predetermined frequency for application to a pair of electrodes by way of a power supply harness which is replaceable partially or wholly to change a wiring length and which is flexible, and a control section configured to set the predetermined frequency of the AC power supply so that the frequency becomes lower as the power supply harness becomes longer.

8 Claims, 5 Drawing Sheets

(56) References Cited

U.S. PATENT DOCUMENTS

| | | | |
|---|---|---|---|
| 2014/0361690 A1* | 12/2014 | Yamada | H01J 37/32155 315/111.21 |
| 2016/0086772 A1* | 3/2016 | Khaja | H01J 37/321 315/111.21 |
| 2017/0178018 A1* | 6/2017 | Tcaciuc | H01F 41/048 |

* cited by examiner

POWER SUPPLY DEVICE FOR PLASMA, PLASMA DEVICE, AND METHOD FOR CONTROLLING POWER SUPPLY DEVICE FOR PLASMA

TECHNICAL FIELD

The description relates to a plasma power supply device configured to apply an AC voltage to a pair of electrodes, a plasma device, and a plasma power supply device control method.

BACKGROUND ART

There is known a plasma device configured to generate a plasma by executing an electric discharge in a source gas. The plasma device is a device for producing a plasma from a gas by applying an AC voltage produced by a plasma power supply device to a pair of electrodes which are spaced apart. Such plasma devices have a variety of applications including an industrial application to working, cleaning, and bonding together surfaces of solid materials, an environment protecting application to sterilization and air purification, a medical application, and the like. At the beginning of the development of plasma devices, a vacuum pump is used to keep the pressure of a source gas at a low pressure (a negative pressure) to produce a stable electric discharge, thereby maintaining the quality of a plasma produced at a required level. In recent years, an atmospheric pressure plasma device using a source gas at an atmospheric pressure has been put into practical use, and with such an atmospheric pressure plasma device, a high plasma density has been able to be obtained. Patent Literature 1 discloses one technical example of a plasma device of this type.

PATENT LITERATURE

Patent Literature 1: JP-A-2012-174736
Patent Literature 2; JP-A-2008-293925

BRIEF SUMMARY

Technical Problem

Incidentally, as described above, since the plasma device has the variety of applications, the length of a power supply harness that connects the electrodes for generating a plasma with the plasma power supply device is desirably changed so as to allow the electrodes configured to generate a plasma to move in accordance with an application.

Since an AC power supply is connected to the power supply harness, a coaxial cable is desirably adopted for the power supply harness; however, it has been difficult to adopt a coaxial cable which is not flexible enough to allow the movement of the electrodes.

The disclosure in this description has been made in view of the situations described above, and a problem that the disclosure is to solve is to provide a plasma power supply device for use in connection with electrodes using a power supply harness having superior flexibility and a plasma device including the same plasma power supply device, and a plasma power supply device control method.

Solution to Problem

In order to solve the problem described above, according to the description, there is disclosed a plasma power supply device including an AC power supply configured to generate an AC voltage of a predetermined frequency to be applied to a pair of electrodes configured to generate a plasma, by way of a power supply harness without being shielded, and a control section configured to set the predetermined frequency of the AC power supply so that the frequency becomes lower as the power supply harness becomes longer.

In order to solve the problem described above, according to the description, there is disclosed a plasma device comprising the plasma power supply device, wherein the pair of electrodes can move relatively to the AC power supply by bending the power supply harness.

In order to solve the problem described above, according to the description, there is disclosed a plasma power supply device control method for controlling a plasma power supply device comprising an AC power supply configured to generate an AC voltage of a predetermined frequency for application to a pair of electrodes configured to generate a plasma by way of a power supply harness with no shield. The plasma power supply device control method includes a step of setting the predetermined frequency of the AC power supply so that the frequency becomes lower as the power supply harness becomes longer.

Advantageous Effects

According to the plasma power supply device disclosed in the description, even though the length of the power supply harness is changed, power can be supplied to the extent enough for generating the same plasma capability without change. According to the plasma device disclosed in the description, even though the length of the power supply harness is changed, plasma capability can be provided as same extent as the plasma capability without change. According to the plasma power supply device control method, even though the length of the power supply harness is changed, power can be supplied to the extent enough for generating the same plasma capability without change.

DESCRIPTION OF EMBODIMENT

Figure 1:
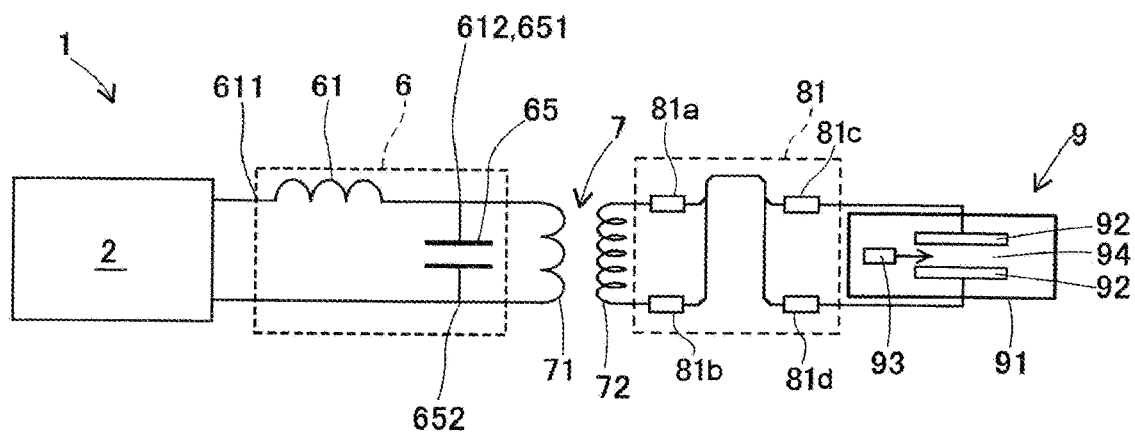
FIG. 1 A drawing showing schematically a plasma power supply device of an embodiment that constitutes a plasma device of the embodiment and a main body section thereof.

1. Configurations of Plasma Power Supply Device and Plasma Device According to the Embodiment Referring to FIGS. 1 to 10, a plasma power supply device and a plasma device of an embodiment will be described. FIG. 1 is a drawing showing schematically plasma power supply device 1 of the embodiment that constitutes a plasma device of the embodiment and main body section 9 thereof. Firstly, main body section 9 will be described. Main body section 9 includes a container 91, pair of electrodes 92, and atmospheric pressure gas removing section 93.

Container 91 defines an interior space from outside air. Pair of electrodes 92 are disposed in such a manner as to face an interior of the container 91. A plasma generation area 94 is defined between pair of electrodes 92. Atmospheric pressure gas removing section 93 introduces a source gas at an atmospheric pressure into generation area 94 and moves a plasma generated in generation area 94. The plasma so generated may be used within container 91 or may be moved to another place for use therein. Oxygen gas, air, dry air, and a mixture gas of nitrogen and oxygen can be exemplified as a source gas. The plasma device of the embodiment is an atmospheric pressure plasma device and has a plasma generation voltage which is generally higher than that of a low atmospheric pressure plasma device. As to the plasma device of the embodiment, there is no need for a vacuum pump to produce low atmospheric pressure (a negative pressure), and hence, the configuration of the plasma device becomes simple.

Plasma power supply device 1 includes pulse width modulation power supply 2, smoothing circuit 6, transformer 7, and power supply harness 81. Pulse width modulation power supply 2 adjusts variably duty ratios of multiple waveforms of positive and negative pulse voltage and outputs them. Smoothing circuit 6 smooths multiple waveforms of positive and negative pulse voltage, being outputted by pulse width modulation power supply 2, to be an AC voltage, and outputs the AC voltage to transformer 7. The waveform of the AC voltage is adjustable in frequency according to whether the multiple waveforms of pulse voltage are positive or negative, or according to the adjusted duty ratios, which may turn out being a sine wave or a distorted wave.

Smoothing circuit 6 includes, for example, coil 61 and capacitor 65 shown in FIG. 1. One end or end 611 of coil 61 is connected to one end at an output side of pulse width modulation power supply 2. The other end or end 612 of coil 61 is connected to one end of primary winding 71 of transformer 7. One end or end 651 of capacitor 65 is connected to end 612 of coil 61 and the one end of primary winding 71. The other end or end 652 of capacitor 65 is connected to the other end at the output side of pulse width modulation power supply 2 and the other end of primary winding 71. Pulse width modulation power supply 2 and smoothing circuit 6 make up an AC power supply of the embodiment. When referred to in this description, an "alternating current" of the "AC power supply" are merely meant such that the alternating current is not a "direct current", and as a range that an "AC frequency", which is a frequency of an alternating current, may take, any frequency from a low frequency to a high frequency may be adopted, as long as a plasma can be generated. However, since a plasma is generated and quenched repeatedly as it follows the AC power supply, an upper limit value of the AC frequency is such that a plasma can be generated and quenched repeatedly. This upper limit value is a value that changes depending upon a waveform of the AC voltage, shapes of electrodes, and the like.

Transformer 7 is a single-phase device and includes primary winding 71 and secondary winding 72 which are coupled together electromagnetically. In transformer 7, the number of turns of secondary winding 72 is greater than the number of turns of primary winding 71, and hence, transformer 7 has a boosting function. One end and the other end of secondary winding 72 are connected to pair of electrodes 92 via power supply harness 81. Although there is no particular structural restriction imposed on transformer 7, transformer 7 preferably has good high-frequency characteristics. Transformer 7 boosts an AC voltage inputted into primary winding 71 and applies the AC voltage so boosted from secondary winding 72 to pair of electrodes 92. Although there is no specific limitation imposed on a boosted voltage, a boosted voltage is preferably set so as to be of the order of 15 kV, and in that case, an effective value is preferably set so as to be of the order of 5 kV.

Power supply harness 81 connects pair of electrodes 92 provided in main body section 9 with plasma power supply device 1 while being insulated from container 91 of main body section 9 in an ensured fashion. Power supply harness 81 is not a coaxial cable. Power supply harness 81 may extend partially or wholly between pair of electrodes 92 and plasma power supply device 1. Specifically, power supply harness 81 connects an output of secondary winding 72 of transformer 7 with pair of electrodes 92, and power supply harness 81 is configured to be detachable with the output of secondary winding 72 of transformer 7 via connectors 81a and 81b, while being detachable with a pair of electrodes 92 via connectors 81c and 81d. Power supply harness 81 is flexible and hence can be bent, and various lengths of power supply harnesses can be adopted as power supply harness 81.

Power supply harness 81 is preferably replaceable partially or wholly for changing a wiring length. Although not limited thereto, power supply harness 81 is a wiring harness including a pair of conductors which constitutes a core, and for example, a cable with no shield such as a cab tire cable or a cable which is shielded incompletely in preference to flexibility although the cable is shielded can be adopted as power supply harness 81. Although the cable is not shielded sufficiently, the cable is sufficiently long, and therefore, no harmonic wave (reflected wave) is generated, or harmonic waves are generated only to such an extent that surrounding environments are not affected.

Power supply harness 81 is such that a power supply harness of an appropriate wiring length can be selected for exchange when required depending upon how to dispose pair of electrodes 92 for use. For example, as in the case that main body section 9 needs to be moved to the vicinity of a treatment target object for a plasma treatment, the length of power supply harness 81 can be set to be a wiring length so as not to interfere with the movement of main body section 9 when it is moved relatively in the estimated range.

Figure 2:
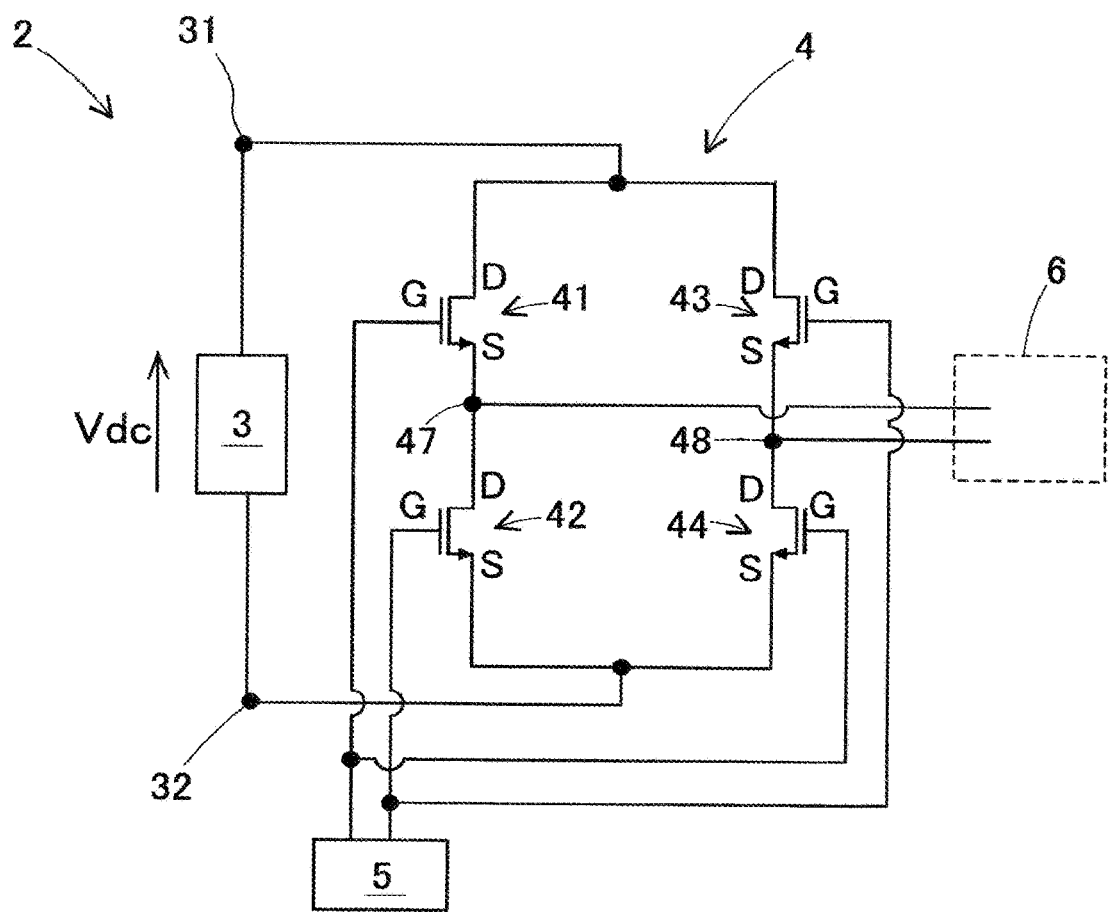
FIG. 2 A circuit diagram showing a circuit configuration of a pulse width modulation power supply.

FIG. 2 is a circuit diagram exemplifying a circuit configuration of pulse width modulation power supply 2. Pulse width modulation power supply 2 incudes DC power supply 3, pulse generation circuit 4, and control section 5. DC power supply 3 outputs a DC voltage Vdc from high-voltage terminal 31 and low-voltage terminal 32. A rectifier power supply for rectifying an AC voltage of a commercial frequency or a battery power supply may be used as DC power supply 3.

Pulse generation circuit 4 is made up by bridge connecting four switching elements. An MOSFET element or an IGBT element can be used as the switching element, and hereinafter, a description will be made based on a case in which an MOSFET element is used as the switching element. First switching element 41 is such that drain D is connected to high-voltage terminal 31 of DC power supply 3 and source S is connected to first output terminal 47. Second switching element 42 is such that drain D is connected to first output terminal 47 and source S is connected to a low-voltage terminal 32 of DC power supply 3. Third switching element 43 is such that drain D is connected to high-voltage terminal 31 of DC power supply 3 and source S is connected to second output terminal 43. Fourth switching element 44 is such that drain D is connected to second output terminal 48 and source S is connected to low-voltage terminal 32 of DC power supply 3.

First output terminal 47 and second output terminal 48 are pulled out to be connected to smoothing circuit 6. Gate G of first switching element 41 and gate G of fourth switching element 44 are collectively connected to control section 5. Gate G of second switching element 42 and gate G of third switching element 43 are also collectively connected to control section 5. In switching elements 41 to 44, electric continuity is realized between drain D and source S only when a control signal is inputted into gate G.

Control section 5 sends out a control signal to gate G to control a switching operation of the switching element. Control section 5 is made up of an electronic control circuit including CPU and configured to be operated by software. Control section 5 is not limited to this configuration and hence may be made up of a hardware circuit. Control section 5 sets a pulse frequency representing a repeated frequency of a pulse voltage waveform. Control section 5 sets an AC frequency of an AC voltage to a predetermined frequency.

The predetermined frequency is set in accordance with the length of power harness 81. The predetermined frequency takes a lower value as power supply harness 81 takes a longer length. 9 kHz can be exemplified as a preferred upper limit value of the predetermined frequency, and 5 kHz or 8 kHz can be exemplified as a preferred lower limit value of the predetermined frequency. Specifically, since the intensity of a plasma outputted from pair of electrodes 92 changes as the length of power supply harness 81 changes, the predetermined frequency is determined so that the change in intensity of the plasma becomes small. For example, the predetermined frequency can be determined by causing magnitudes of electric powers that are supplied to pair of electrodes 92 to become the same. Specifically, the predetermined frequency takes a relatively low value as power supply harness 81 takes a relatively long length. For example, the predetermined frequency can take a value of the order of 9 kHz when the length of the cable is 5 m, while the predetermined frequency can take a value of the order of 8 kHz when the length of the cable is 7 m.

Figure 3:
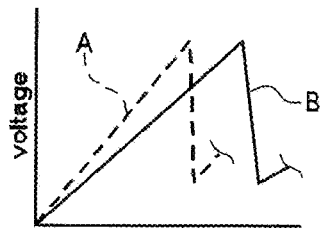
FIG. 3 A schematic drawing illustrating a delay in rise of a voltage in case B in which a power supply harness is longer than in case A in which the power supply harness has a normal length.

The reason that the predetermined frequency takes a lower value as power supply harness 81 takes a longer length is as follows. A parasitic capacity or the like exists in power supply harness 81. Since the parasitic capacity or the like of power supply harness 81 becomes greater as power supply harness 81 takes a longer length, even though the same predetermined frequency is outputted as an AC frequency, a rise of a voltage that is supplied to the pair of electrodes 92 delays more as power supply harness 81 becomes longer in length. For example, as schematically shown in FIG. 3, in case B in which the length of power supply harness 81 is relatively long, a rise of a voltage supplied to the pair of electrodes 92 delays with comparison of case A in which the length of power supply harness 81 is relatively short.

In a plasma device in which an electric discharge is executed between the pair of electrodes 92, there is a cycle in which an electric discharge is executed after a voltage across the pair of electrodes 92 reaches a constant level, and thereafter an electric discharge is executed again when the voltage increases to the constant level, and such a cycle is repeated multiple times even during one period of an alternating current (refer to FIGS. 8 and 9, which will be described later). When the rise delays as in case B described before, even though the length of one period remains the same, the number of times of execution of electric discharge becomes smaller than in case A. As a result, although the same power is supplied, the intensity of a plasma generated becomes relatively small when power supply harness 81 becomes long.

Figure 8:
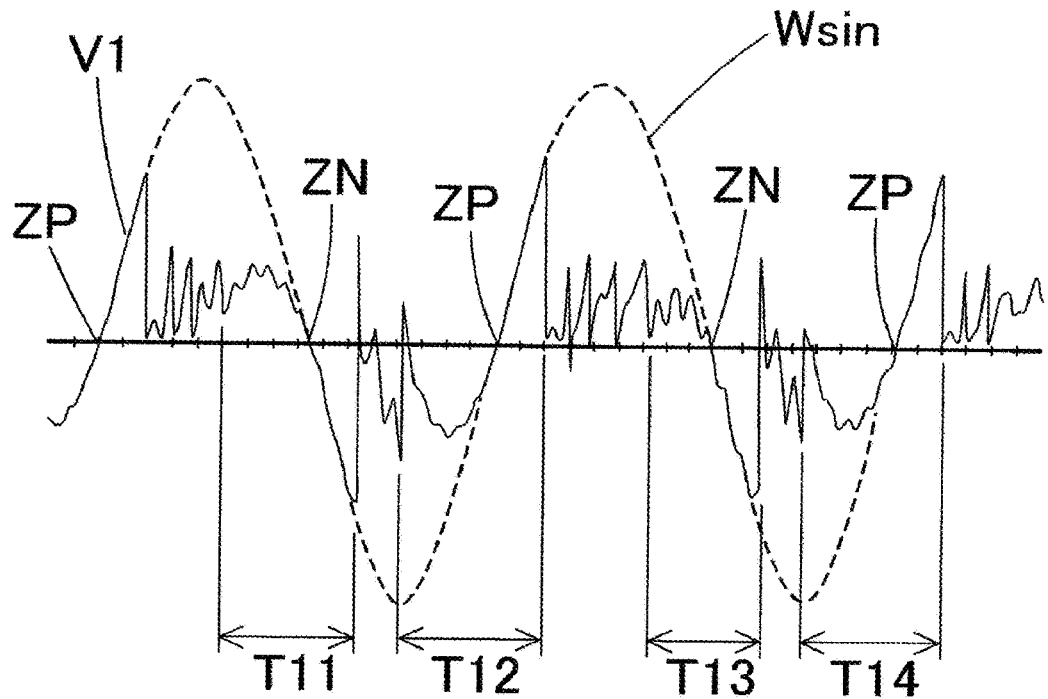
FIG. 8 A drawing showing the results of an actual measurement of a voltage waveform between electrodes showing a plasma generation state when a sinusoidal AC voltage waveform is applied.
Figure 9:
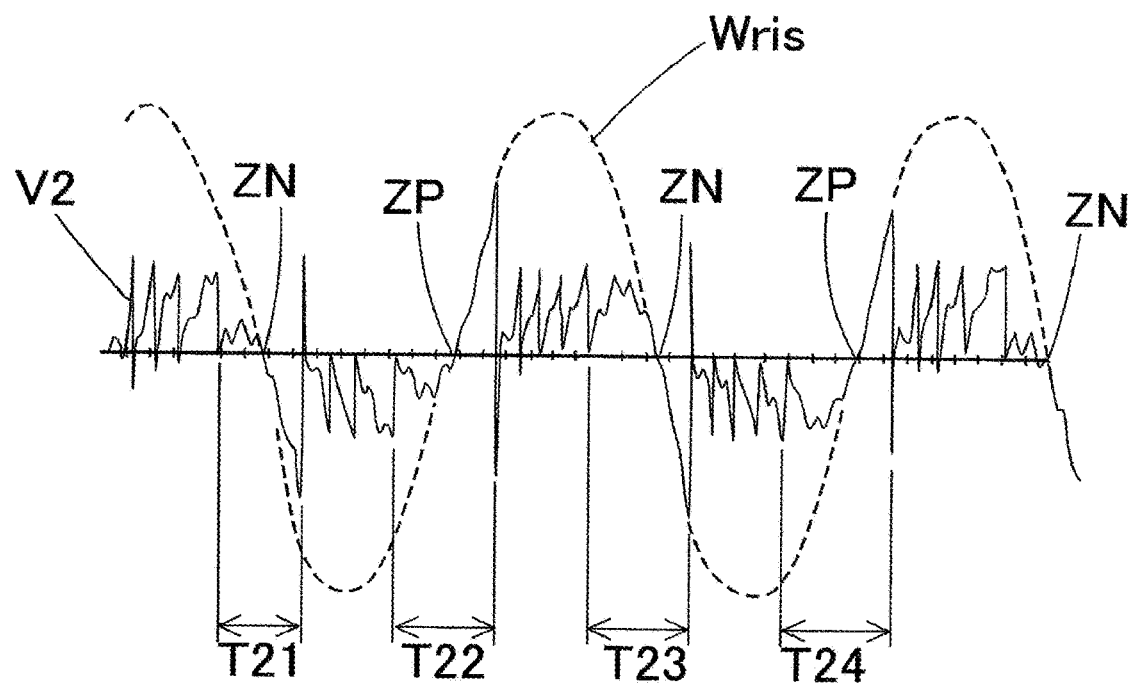
FIG. 9 A drawing showing the results of an actual measurement of a voltage waveform between the electrodes showing a plasma generation state when a distorted wave AC voltage waveform is applied.

As shown in FIG. 8, ineffective period T11 which does not contribute to the generation of a plasma exists for a certain period of time in this one cycle. Since a length of the ineffective period does not change equally even though one cycle of the AC frequency varies, even when the rise of a voltage delays as in case B, a ratio of the ineffective period which does not contribute to the generation of a plasma to the whole length of the one cycle becomes relatively small by extending the length of the cycle through reduction of the AC frequency. As a result, the intensity of a plasma per unit time can be ensured when evaluated as a whole.

Control section 5 determines on a predetermined frequency by obtaining the length of power supply harness 81 using an appropriate process. For example, control section 5 may include a power supply harness length input mechanism into which an operator inputs a length of power supply harness 81 on an operation panel or the like of the plasma device or the plasma power supply device 1. In addition, control section 5 may adopt, as a configuration of power supply harness 81, a mechanism configured to output a length of power supply harness 81 to control section 5, for example, a device configured to read information which is installed in advance in any of connectors 81a to 81d relating to a length of power supply harness 81 (information on the shape of the connector, electrics information on a resistance value, or the like) and output the information to control section 5.

A value of 200 kHz can be exemplified as a pulse frequency. The number of pulses obtained by dividing the pulse frequency by the AC frequency represents the number of pulse voltage waveforms per one cycle of the AC voltage. The number of pulses is preferably several tens or more.

Furthermore, control section 5 can make a rise of an AC voltage applied to pair of electrodes 92 faster as power supply harness 81 becomes longer. In place of or in addition to making the rise of the AC voltage faster, control section 5 can also make a fall of the AC voltage slower. Since the intensity of a plasma can be increased by making the rise of the AC voltage faster or making the fall of the AC voltage slower, a decrease in intensity of the plasma as a result of power supply harness 81 becoming longer can be compensated. The waveform of the AC voltage whose rise is made faster or fall is made slower is referred to as a distorted wave AC voltage waveform against a waveform of a normal AC voltage (a sinusoidal AC voltage waveform). Additionally, control section 5 can also increase an AC voltage to be applied as power supply harness 81 becomes longer. Since the intensity of a plasma can be increased by increasing an AC voltage to be applied, a decrease in intensity of the plasma resulting from lengthening power supply harness 81 can be compensated by doing so.

Control section 5 sends out no control signal to second switching element 42 and third switching element 43 and maintains a state in which a control signal is cut off for a time slot corresponding to a half wave of a positive AC voltage. In addition, control section 5 sends out a time length variable control signal to first switching element 41 and fourth switching element 44 for an opening and closing control thereof to thereby adjust a duty ratio of a pulse waveform variably. As a result, pulse width modulation power supply 2 outputs multiple positive pulse voltage waveforms whose duty ratios are adjusted.

In addition, control section 5 sends out no control signal to first switching element 41 and fourth switching element 44 and maintains a state in which a control signal is cut off for a time slot corresponding to a half wave of a positive AC voltage. In addition, control section 5 sends out a time length variable control signal to second switching element 42 and third switching element 43 for an opening and closing control thereof to thereby adjust a duty ratio of a pulse waveform variably. As a result, pulse width modulation power supply 2 outputs multiple negative pulse voltage waveforms whose duty ratios are adjusted. Heights of the positive and negative pulse-voltage waves coincide with DC Vdc of DC power supply 3.

Figure 4:
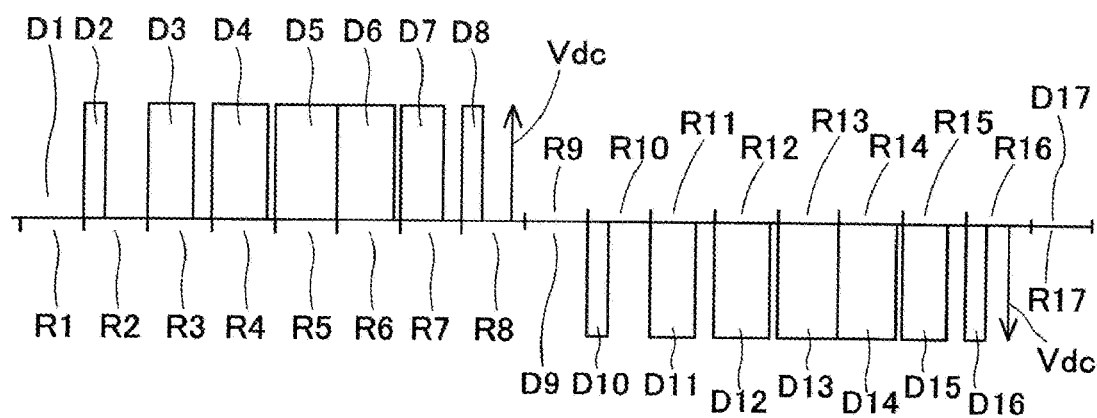
FIG. 4 A drawing schematically showing a control method that a control section performs when a sinusoidal AC voltage is outputted to a transformer.
Figure 5:
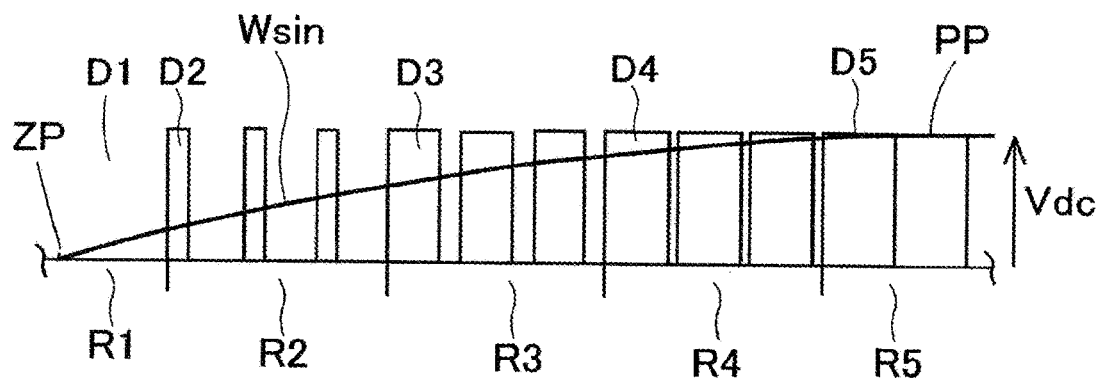
FIG. 5 A drawing showing a pulse voltage waveform and a sinusoidal AC voltage waveform when the sinusoidal AC voltage is outputted to the transformer as shown in FIG. 4.

2. Operation and Function of Plasma Power Supply Device 1 of the Embodiment Next, an operation and function of plasma power supply device 1 of the embodiment will be described. FIG. 4 is a drawing schematically showing a control method that control section 5 performs when a sinusoidal AC voltage is outputted to transformer 7. FIG. 5 is a drawing showing a pulse voltage waveform and sinusoidal AC voltage waveform Wsin when the sinusoidal AC voltage is outputted to the transformer as shown in FIG. 4. In the case shown in FIG. 4, control section 5 divides a time slot corresponding to one cycle of an AC voltage into 17 intervals from 1st interval R1 to 17th interval R17. A length of one cycle is determined from the AC frequency (the predetermined frequency) which is determined in accordance with the length of power supply harness 81. In 1st interval R1 and 17th interval R17, only a half of a time width falls within one cycle of the AC voltage. Multiple pulse voltage waveforms fall in each of 1st to 17th interval R1 to R17.

Here, 1st interval R1 to 5th interval R5 correspond to a rise of a positive half wave of the AC voltage, Therefore, in 1st to 5th intervals R1 to R5, control section 5 subsequently increases duty ratios D1 to D5 to match an increasing tendency of the rise of a sinusoidal wave. To express this subsequent increase of duty ratios D1 to D5 by an inequality, the following relationship holds. Duty ratio D1 of 1st interval<duty ratio D2 of 2nd interval R2<duty ratio D3 of 3rd interval R3<duty ratio D4 of 4th interval R4<duty ratio D5 of 5th interval R5.

5th interval R5 to 9th interval R9 correspond to a fall of the positive half wave of the AC voltage. Therefore, in 5th to 9th intervals R5 to R9, control section 5 subsequently decreases duty ratios D5 to D9 to match a decreasing tendency of the fall of the sinusoidal wave. To express this subsequent increase of duty ratios D1 to D5 by an inequality, the following relationship holds. Duty ratio D5 of 5th interval>duty ratio D6 of 6th interval R6>Duty ratio D7 of 7th interval R7>Duty ratio D8 of 8th interval R8>duty ratio D9 of 9th interval R9.

Similarly, 9th interval R9 to 17th interval R17 correspond to a negative half wave of the AC voltage. Therefore, in 9th to 17th intervals R9 to R17, control section 5 subsequently increases and decreases duty ratios D9 to D17 to match a decreasing tendency of the negative and an increasing tendency of the fall of the sinusoidal wave. To express this subsequent increase of duty ratios D1 to D5 by an inequality, the following relationship holds.

Duty ratio D9 of 9th interval R9<duty ratio D10 of 10th interval R10<duty ratio D11 of 11th interval R11<duty ratio D12 of 12th interval R12<duty ratio D13 of 13th interval R13.

Duty ratio D13 of 13th interval R13>duty ratio D14 of 14th interval R14>duty ratio D15 of 15th interval>duty ratio D16 of 16th interval R16>duty ratio D17 of 17th interval R17.

As a specific example, control section 5 sets duty ratios D1 to D17 of 1st to 17th intervals R1 to R17 as follows.

$$D1=D9=D17=0[\%]$$

$$D2=D8=D10=D16=30[\%]$$

$$D3=D7=D1=D15=70[\%]$$

$$D4=D6=D12=D14=90[\%]$$

$$D5=D13=100[\%]$$

Here, FIG. 5 shows a time slot corresponding to a rise of a positive half wave of an AC voltage in which three pulse voltage waveforms are put in each of 1st to 17th intervals R1 to R17. FIG. 5 shows 12 pulse voltage waveforms in total of one and a half pulse voltage waveforms of duty ration D1, three pulse voltage waveforms of each of duty ratios D2 to D4, and one and a half pulse voltage waveforms of duty ratio D5. These pulse voltage waveforms are smoothed at smoothing circuit 6, whereby sinusoidal AC voltage waveform Wsin from zero point ZP to positive peak point PP is obtained. Actually, sinusoidal AC voltage waveform Wsin outputted from smoothing circuit 6 has a phase delay with respect to a pulse voltage waveform.

Figure 6:
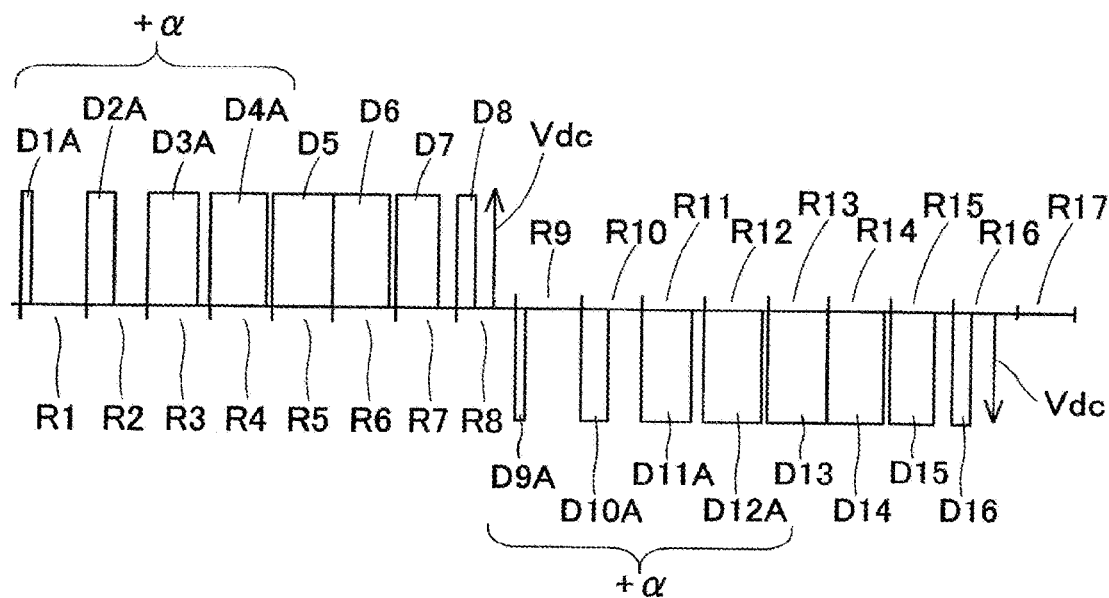
FIG. 6 A drawing schematically showing a control method that the control section performs when a distorted wave AC voltage is outputted to the transformer.

FIG. 6 is a drawing schematically showing a control method that control section 5 performs when a distorted wave AC voltage is outputted to transformer 7. In FIG. 6, control section 5 performs a leading-edge or rise modulation in which a rise of a voltage waveform is made faster than in a sinusoidal AC voltage. A degree or a speed at which a voltage waveform rises is preferably made faster as an AC frequency becomes lower, that is, power supply harness 81 becomes longer. As a specific example, control section 5 adjusts some of duty ratios so that duty ratios D1A to D4A of 1st interval R1 to 4th interval R4 and duty ratios D9A to D12A of 9th interval R9 to 12th interval R12 are increased as follows.

$$D1A=D9A=(D1+\alpha)[\%]$$

$$D2A=D10A=(D2+\alpha)[\%]$$

$$D3A=D11A=(D3+\alpha)[\%]$$

$$D4A=D12A=(D4+\alpha)[\%]$$

However, control section 5 performs no trailing edge or fall modulation. Therefore, duty ratios D5 to D8 and duty ratios D13 to D16 coincide with those of a sinusoidal AC voltage. The +αs described above may be different from each other or ay be common in each of intervals R1 to R4 and R9 to R12. For example, +α is set at 10 [%] in common for each of intervals R1 to R4 and R9 to R12.

Figure 7:
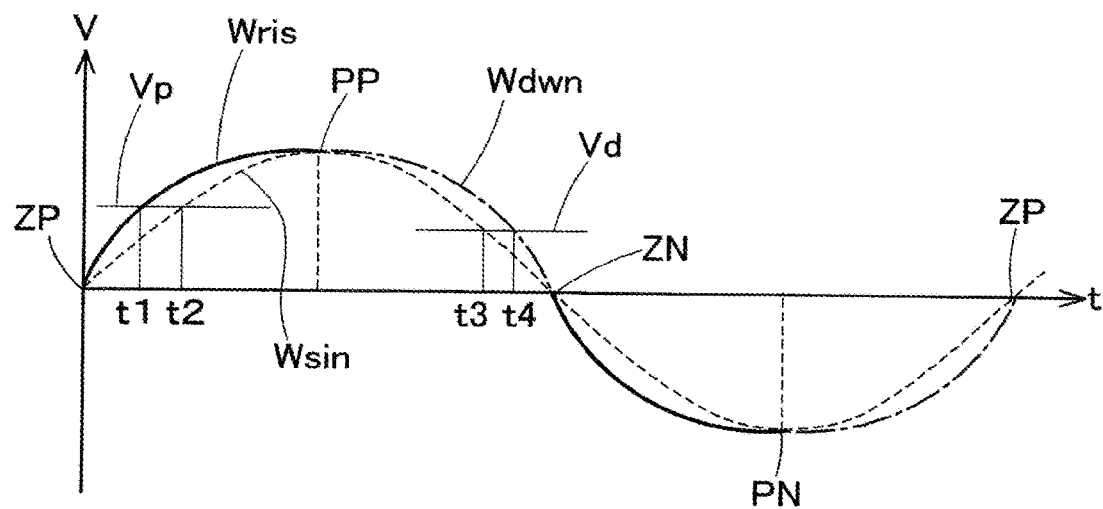
FIG. 7 A drawing showing AC voltage waveforms generated from pulses in FIG. 6 (a solid line) and FIG. 4 (a broken line) for output to the transformer.

As a result of control section 5 performing the rise modulation, distorted AC voltage waveform Wris (refer to FIG. 7) is outputted to transformer 7. Actually, distorted AC voltage waveform Wris outputted from smoothing circuit 6 has a phase delay with respect to a pulse voltage waveform. FIG. 7 is a drawing showing AC voltage waveforms which are outputted to transformer 7 in the embodiment and a comparison example. In FIG. 7, an axis of abscissa represents a time axis t, and an axis of ordinate represents voltage V. In FIG. 7, sinusoidal AC voltage waveform Wsin of the comparison example is indicated by a broken line. In distorted wave AC voltage waveform Wris of the embodiment, a leading edge or rise is indicated by a solid line, and a trailing edge or fall coincides with that of the sinusoidal AC voltage waveform Wsin.

As shown by a positive half wave in FIG. 7, in distortion wave AC voltage waveform Wris, a waveform rises faster than in sinusoidal AC voltage waveform Wsin. Therefore, time t1 at which distorted wave AC voltage waveform Wris reaches plasma generation voltage Vp comes earlier than time t2 at which sinusoidal AC voltage waveform Wsin reaches plasma generation voltage Vp. The description made above also holds true of a negative half wave. Therefore, by performing the rise modulation (with the rise modulation), a time slot where a plasma can be generated expands wider than in a case in which no rise modulation is performed (without rise modulation). As a result, a decrease in intensity of a plasma that is caused as result of power supply harness 81 becoming longer can be compensated effectively.

In place of distorted wave AC voltage waveform Wris on which the rise modulation, distorted wave AC voltage waveform Wdwn on which the fall modulation is performed can also be used. In FIG. 7, a leading edge or rise of distorted wave AC voltage waveform Wdwn coincides with that of sinusoidal AC voltage waveform Wsin, and a trailing edge or fall thereof is indicated by an alternate long and short dash line. As a specific example in which the fall modulation is performed, control section 5 adjusts duty ratios so that duty ratios D6 to D9 of 6th interval R6 to 9th interval R9 and duty ratios D14 to D17 of 14th interval R14 to 17th interval R17 are increased by +β[%]. Since control section 5 performs no rise modulation, duty ratios D2 to D5 and duty ratios d10 to S13 coincide with those of the sinusoidal AC voltage.

As shown by the positive half wave in FIG. 7, in the distorted wave AC voltage waveform Wdwn on which the fall modulation is performed, a waveform falls slower than in the sinusoidal AC voltage waveform Wsin. Therefore, time t4 at which distorted wave AC voltage waveform Wdwn decreases to plasma extinction voltage Vd comes later than time t3 at which sinusoidal AC voltage waveform Wsin decreases to plasma extinction voltage Vd. The description made above also holds true of a negative half wave. Therefore, when distortion wave AC voltage waveform Wdwn on which the fall modulation is performed is used, a time slot where a plasma can be generated expands wider than when the sinusoidal AC voltage wave is used.

Further, a distorted wave AC voltage waveform can also be used on which both the rise modulation and the fall modulation are performed. This generates an effect to expand the time slot where a plasma can be generated in both the rise and fall of the voltage waveform.

In distorted wave AC voltage waveform Wris and distorted wave AC voltage waveform Wdwn, when compared with sinusoidal AC voltage waveform Wsin, zero point ZP, positive peak point PP, zero point ZN, and negative peak point PN of the voltage waveform do not move on the time axis t. Further, in distorted wave AC voltage waveform Wris and distorted wave AC voltage waveform Wdwn, a voltage instantaneous value smoothly and monotonously increases from zero point ZP to positive peak point PP and from negative peak point PN to zero point ZP, and the voltage instantaneous value smoothly and monotonously decreases from positive peak point PP to negative peak point PN through zero point ZN.

Since distorted wave AC voltage waveform Wris and distorted wave AC voltage waveform Wdwn have the properties described above, a high-frequency component content is limited. As a result, transformer 7 can boost the voltage by suppressing the deformation or distortion of the voltage waveform. Further, losses generated by transformer 7 do not increase significantly when compared with a case with the sinusoidal AC voltage waveform Wsin. In case a pulse waveform containing many high-frequency components is inputted into primary winding 71 of transformer 7, a voltage waveform in secondary winding 72 deforms or distorts remarkably. Furthermore, the input of the pulse waveform described above into transformer 7 calls for an increase in the generated loss in transformer 7 and an increase in noise and vibration. Therefore, it is impractical to boost a pulse waveform by transformer 7.

For reference, the results of actual measurements of plasma generation states in the case shown in FIG. 4 (with rise modulation) and the case shown in FIG. 6 (without rise modulation) will be described. FIG. 8 is a drawing showing the results of an actual measurement of voltage waveform V1 between electrodes 92 showing a plasma generation state when there exists no rise modulation. FIG. 9 is a diagram showing the results of an actual measurement of voltage waveform V2 between electrodes 92 showing a plasma generation state when there exists a rise modulation. An AC frequency of sinusoidal AC voltage waveform Wsin shown by to broken line in FIG. 8 and an AC frequency of distorted wave AC voltage waveform Wris shown by a broken line in FIG. 9 are both 5 kHz.

In FIG. 8, when a plasma is generated, electric continuity is almost established between electrodes 92, and a voltage instantaneous value of voltage waveform V1 greatly decreases from sinusoidal AC voltage waveform Wsin. This allows ineffective periods T11, T12, T13, and T14, which do not contribute to the generation of a plasma, to be distinguished from other periods. Similarly, in FIG. 9, when a plasma is generated, electric continuity is almost established between electrodes 92, and a voltage instantaneous value of voltage waveform V2 greatly decreases from distorted wave AC voltage waveform Wris. This allows ineffective periods T21, T22, T23, and T24, which do not contribute to the generation of a plasma, to be distinguished from others. Each of ineffective periods T11, T12, T13, T14, T21, T22, T23, and T24 includes either of zero point ZP and zero point ZN.

Here, ineffective periods T21, T22, T23, and T24 which include a rise modulation have in average a shorter time width than that of ineffective periods T11, T12, T13, and T14 on which a rise modulation is not performed. In particular, in ineffective periods T21, T22, T23, and T24, a time width after zero point ZP or after zero point ZN is short. This is an effect caused by making the rise of distorted wave AC voltage waveform Wris faster than that of sinusoidal AC voltage waveform Wsin, as described using FIG. 7. Therefore, with distorted wave AC voltage waveform Wris on which the rise modulation is performed, when compared with sinusoidal AC voltage waveform Wsin on which no rise modulation is performed, the time slot where a plasma can be generated is expanded in one cycle of the Ac voltage.

3. Mode and Advantageous Effect of Plasma Power Supply Device 1 of Embodiment Plasma power supply device 1 of the embodiment is plasma power supply device 1 configured to generate a plasma by applying an AC voltage to pair of electrodes 92 via replaceable power supply harness 81. Plasma power supply device 1 of the embodiment includes control section 5 configured to reduce the AC frequency to a smaller level as power supply harness 81 becomes longer.

In addition, plasma power supply device 1 of the embodiment includes the AC power supply configured to output at least either of distorted wave AC voltage waveform Wris on which the rise modulation is performed in which the voltage waveform is made to rise faster than that of sinusoidal AC voltage waveform Wsin as power supply harness 81 becomes long and distorted AC voltage waveform Wdwn on which the fall modulation is performed in which the voltage waveform is made to fall down slower harness that of sinusoidal AC voltage waveform Wsin as power supply harness 81 becomes long.

The AC frequency of the alternating current supplied to pair of electrodes 92 is made to decrease to a relatively low level as power supply harness 81 becomes longer in length. Further, the control can also be performed to make the voltage waveform rise faster as power supply harness 81 becomes longer in length.

According to this configuration, since the AC frequency is controlled in accordance with the length of power supply harness 81, even though the electric power supplied to pair of electrodes 92 decreases as a result of power supply harness 81 becoming longer, the decrease in intensity of a plasma to be generated can be suppressed by decreasing the AC frequency.

Further, since the voltage waveform is made to rise faster or is made to fall slower than that of sinusoidal AC voltage waveform Wsin even though power supply harnesses 81 become longer whereby it becomes relatively difficult for electric power which is to be supplied to pair of electrodes 92 to be so supplied, the time slot where a plasma can be generated expands in one cycle of the AC voltage. Therefore, plasma power supply device 1 of the embodiment can suppress the reduction in the plasma generation capability to a minimum level even though the length of power supply harness 81 is changed as a result of replacing power harnesses 81.

4. Mode and Advantageous Effect of Plasma Device 1 of Embodiment

The plasma device of the embodiment includes container 91 for generating a plasma, pair of electrodes 92 disposed in the interior of container 91, and plasma power supply device 1 of the embodiment. Pair of electrodes 92 and plasma power supply device 1 are connected to each other by power supply harness 81. Power supply harness 81 may be replaceable with a power supply harness having an appropriate length as required with flexibility. Even though a configuration is adopted in which power supply harness 81 having flexibility is replaceable as required, a decrease in intensity of a plasma to be generated can be suppressed.

5. Application and Modification of the Embodiment

Figure 10:
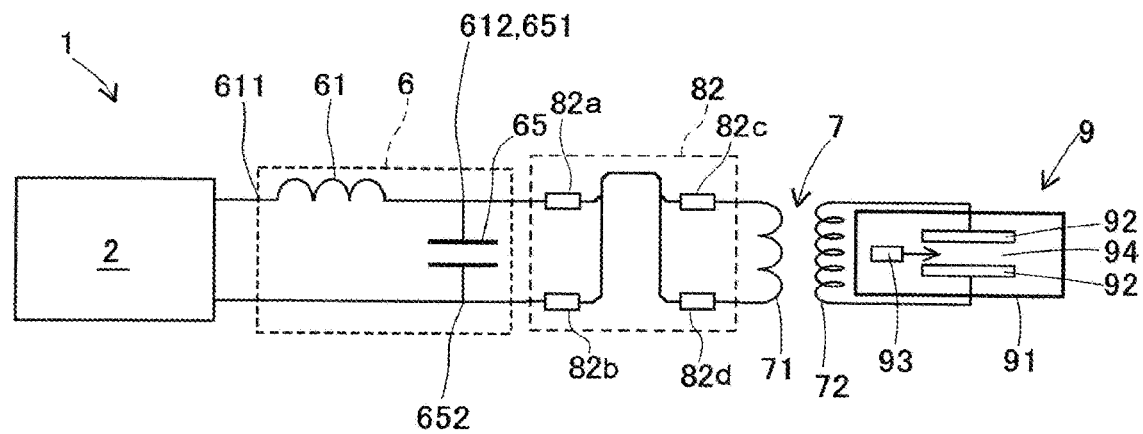
FIG. 10 A schematic drawing showing a modified form made to the configuration shown in FIG. 1.

The setting methods of 1st to 17th intervals R1 to R17 and duty ratios D1 to D17, D1A to D4A, and D9A to D12A which are described in the embodiment are only the examples, and there exist many modified examples. For example, in place of power supply harness 81 which connects the output of secondary winding 72 of transformer 7 with pair of electrodes 92, power supply harness 82 can also be adopted which connects an output of smoothing circuit 6 with primary winding 71 of transformer 7 (FIG. 10). In this case, too, the same working effect as the one exhibited when power supply harness 81 is adopted can be exhibited by adopting the same control as the one adopted therefor.

Additionally, all the duty ratios of multiple pulse voltage waveforms corresponding to the rise of the AC voltage may be different and may gradually increase. In addition, the pulse frequency and the AC frequency can also be changed as required. The AC frequency is preferably higher because sound of a small volume is generated. Further, since sound of the order of 3 kHz is easiest to hear, when the AC frequency is set at a range higher than 3 kHz, the AC frequency is preferably set at a frequency as high as possible because the generation of annoying sound can be suppressed thereby.

Furthermore, the application of the plasma power supply device of the embodiment is not limited to the atmospheric pressure plasma device, and hence, the plasma power supply device can also be applied to, for example, a low pressure plasma device with transformer 7 omitted. The embodiment can also be applied to other various applications and modified variously.

6. Plasma Irradiation System Using Plasma Device

By way of example, a plasma irradiation system of the embodiment which makes use of a plasma device will be described.

Figure 11:
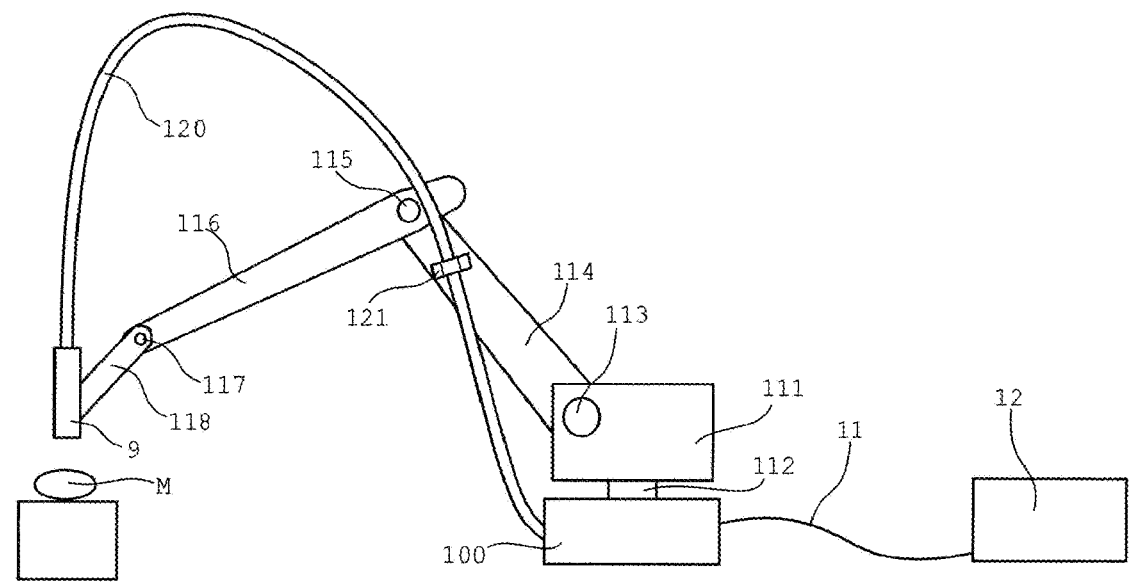
FIG. 11 A drawing schematically showing a plasma irradiation system according to the embodiment.

As shown in FIG. 11, the plasma irradiation system of the embodiment includes the plasma device (100, 120, 9, 11, 12) of the embodiment which is described above, and a plasma device driving apparatus (111 to 118). The plasma device (100, 120, 9, 11, 12) of the embodiment includes base section 100, main body section 9, communication member 120 for establishing a communication between base section 100 and main body section 9 operation device 12, and connection member 11 for connecting operation device 12 with base section 100.

Base section 100 accommodates therein pulse width modulation power supply 2, smoothing circuit 6, and transformer 7, which constitute part of plasma power supply device 1 of the embodiment, and an inert gas supply device. Communication member 120 is such as to tie up power supply harness 81 and an inert gas supply tube. The inert gas supply tube is a tube used for communicating inert gas supplied from the inert gas supply device in base section 100 to an atmospheric pressure gas removing section of main body section 9, Communication member 120 is covered with a flexible pipe having flexibility, and a middle portion thereof is fixed to a side surface of upper arm 114, which will be described later, by attachment section 121.

Operation device 12 operates the plasma irradiation system of the embodiment and is connected to base section 100 by connection apparatus 11 so as to output an operation signal to base section 100 and the plasma device driving apparatus (111 to 118).

The plasma device driving apparatus (111 to 118) constitutes a multi-axis robot configured to drive main body section 9 of the plasma device three-dimensionally so as to adjust it at an angle at which a plasma generated at main body section 9 is applied to a treatment target object M effectively.

The plasma device driving apparatus (111 to 118) is made up of a multi-joint robot including arm holding section 111, upper arm 114, lower arm 116, and support arm 118. Arm holding section 111 is formed on base section 100 via arm swiveling section 112 so as to be driven to swivel on a horizontal plane. Upper arm 114 is attached pivotally to arm holding section 111 via upper arm turning section 113 so as to be driven to turn. Lower arm 116 is attached pivotally to upper arm 114 via lower arm turning section 115 so as to be driven to turn on a perpendicular plane. Support arm 118 is attached pivotally to lower arm 116 via support arm turning section 117 so as to be driven to turn on a perpendicular plane. Support arm 118 holds main body section 9 at a distal end thereof.

By configuring the plasma irradiation system as described heretofore, main body section 9 where a plasma is generated can be caused to take an appropriate relative positional relationship with treatment target object M using the plasma device driving apparatus (111 to 118). As a result, a plasma so generated can be made effective use of.

Furthermore, the relative positional relationship between main body section 9 and treatment target object M can be made more appropriate by driving treatment target object M three-dimensionally using a similar apparatus to the plasma device driving apparatus (111 to 118).

REFERENCE SIGNS LIST

1: Plasma power supply device, 2: Pulse width modulation power supply, 3: DC power supply, 4: Pulse generation circuit, 41: First switching element, 42: Second switching element, 43: Third switching element, 44: Fourth switching element, 5: Control section, 6: Smoothing circuit, 7: Transformer, 81, 82: Power supply harness, 9: Main body section, 92: Electrode, 93: Atmospheric pressure gas removing section, 100: Base section, 111-118: Plasma device driving apparatus, 120: Communication member, 12: Operation device, D1-D17, D1A-D4A D9A-D12A: Duty ratio, Wsin: Sinusoidal AC voltage waveform (rise modulation), Wris: Distorted wave AC voltage waveform (rise modulation), Wdwn: Distorted wave AC voltage waveform (fall modulation), ZP: Zero point, PP: Peak point, ZN: Zero point, PN: Negative peak point, A: Case in which a power supply harness has a short length, B: Case in which power supply harness has a long length, M: Treatment target object

The invention claimed is:

1. A plasma power supply device comprising:
an AC power supply configured to generate an AC voltage of a predetermined frequency to be applied to a pair of electrodes configured to generate a plasma by way of an unshielded power supply harness that includes a pair of conductors constituting a core, each conductor being detachably coupled to a respective electrode from the pair of electrodes; and
a control section configured to set the predetermined frequency of the AC power supply so that the frequency becomes lower as the power supply harness becomes longer,
wherein the control section is further configured to (i) receive information indicating a wiring length of the power supply harness, and (ii) set the predetermined frequency of the AC power supply based on the wiring length of the power supply harness.

2. The plasma power supply device according to claim 1, wherein
the power supply harness is replaceable partially or wholly to change a wiring length and is flexible.

3. The plasma power supply device according to claim 1, wherein the control section controls the predetermined frequency within a range of 9 kHz or smaller.

4. The plasma power supply device according to claim 1, wherein the control section causes a voltage waveform to rise faster as the power supply harness is longer.

5. The plasma power supply device according to claim 1, wherein the control section causes a voltage applied to the pair of electrodes to be increased higher as the power supply harness is longer.

6. The plasma power supply device according to claim 1, wherein the AC power supply comprises:
a pulse width modulation power supply configured to adjust variably duty ratios of multiple waveforms of positive and negative pulse for output; and
a smoothing circuit configured to smooth the multiple positive and negative voltage waveforms into the AC voltage.

7. A plasma device comprising:
the plasma power supply device according to claim 1, wherein
the pair of electrodes can move relatively to the AC power supply by bending the power supply harness.

8. A plasma power supply device control method for controlling a plasma power supply device comprising an AC power supply configured to generate an AC voltage of a predetermined frequency for application to a pair of electrodes configured to generate a plasma by way of an unshielded power supply harness, the plasma power supply device control method comprising:
a step of setting the predetermined frequency of the AC power supply so that the frequency becomes lower as the power supply harness becomes longer, wherein
the power supply harness includes a pair of conductors constituting a core, each conductor being detachably coupled to a respective electrode from the pair of electrodes, and
wherein the step of setting the predetermined frequency of the AC power supply includes (i) receiving information indicating a wiring length of the power supply harness, and (ii) setting the predetermined frequency of the AC power supply based on the wiring length of the power supply harness.

* * * * *